United States Patent [19]
Hashizume

[11] Patent Number: 5,917,370
[45] Date of Patent: Jun. 29, 1999

[54] SPLIT LOAD RESISTOR FOR WIDEBAND PREAMPLIFIER FOR MAGNETO-RESISTIVE HEAD

[75] Inventor: Motomu Hashizume, Plano, Tex.

[73] Assignee: Texas Instruments Incorporated, Dallas, Tex.

[21] Appl. No.: 08/819,065

[22] Filed: Mar. 18, 1997

Related U.S. Application Data

[60] Provisional application No. 60/015,750, Apr. 15, 1996.

[51] Int. Cl.$^6$ ....................................................... H03F 3/68
[52] U.S. Cl. .............................. 330/51; 330/295; 360/46; 360/67; 327/411
[58] Field of Search .................................. 330/51, 124 R, 330/295; 360/46, 67, 68; 327/407, 411

[56] References Cited

U.S. PATENT DOCUMENTS

| | | |
|---|---|---|
| 3,904,977 | 9/1975 | Barsotti ...................................... 330/51 |
| 4,905,238 | 2/1990 | Rinaldis .............................. 327/411 X |
| 5,122,915 | 6/1992 | Klein . | |

*Primary Examiner*—James B. Mullins
*Attorney, Agent, or Firm*—W. Daniel Swayze, Jr.; Wade James Brady, III; Richard L. Donaldson

[57] ABSTRACT

A switch (380) couples one group of MR channels (340, 342, 344) while decoupling another group of MR channels (340, 342 and 344). Thus, the parasitic capacitance associated with the decoupled group of MR channels does not limit the frequency response of the preamplifier.

4 Claims, 2 Drawing Sheets

SPLIT LOAD RESISTOR FOR WIDEBAND PREAMPLIFIER FOR MAGNETO-RESISTIVE HEAD

This application claims priority under 35 USC § 119(e) (1) provisional application number 60/015,750, filed May 15, 1996.

TECHNICAL FIELD OF THE INVENTION

The present invention relates to preamplifier circuits, and more particularly to preamplifier circuits used in MR systems having at least one magnetic disk.

BACKGROUND OF THE INVENTION

Magnetic disc drives have read/write heads, which are used for both writing data to magnetic disc and reading data from the magnetic disc. During a write operation, a write signal is provided to a selected read/write head from a write control circuit. The write signal represents data to be encoded onto the magnetic disc. More particularly, the read/write head receives encoded digital data from a "channel" chip. The transitions of the signal received from the channel chip cause the write current flowing within the read/write head to reverse direction which, in turn, induces a flux reversal in the magnetized material of the medium.

During a read operation, the read/write head senses these flux reversals from the magnetic disc. The flux reversals, as described hereinabove, had been encoded onto the magnetic disc during the write operation. Based on the flux reversals, the read/write head provides a read signal to the read circuit. The read channel amplifies the read signal and a channel circuit recovers the data that had been encoded. The channel circuit then provides the data to a magnetic disc controller for further processing.

Recent developments in high density read channel head technology have resulted in magneto-resistive (MR) heads which need bias currents up to 20 milli amps while delivering up to 20 micro voltage of signal amplitude. Even so, very low noise levels are still necessary to pick up much smaller signals while also being capable of handling relatively large signal swings at high frequencies. Miniaturization of tape and disc storage technology requires the integration of more than one preamplifier along with biasing capabilities for both read and bias MR heads.

FIG. 1 illustrates a single ended preamp integrated circuit 100. The single ended preamp IC 100 includes two MR channels 140 and 142. These channels are connected in a cascoded configuration. Although, two channels are illustrated, additional channels could be added to the cascoded configuration. MR channel 140 includes MR resistance 110, which corresponds to the resistive of the actual MR head. Each of the MR channels are controlled to the individually and selectively operative. More particularly, a current path through the magnetic resistance 110 is controlled by transistor 112. The switch 114 controls the transistor 112 by being connected to the base of the transistor 112. When the switch 114 is open the base is raised to a voltage which exceeds the threshold potential, this causes the transistor to enter the conduction state so that a conduction path is established between the emitter and collector. The switch 114 is controlled through control line 144. Normally, only one MR channel is activated at any one time. Other MR channels, for example, MR channel 142 may be activated by a different control sign to switch 124. The current path for the MR channel is connected to a common current path, which includes the load resistance 138 and common cascode transistor 130. The base of the common control transistor 130 is connected to a voltage source 132. The voltage source is sufficient so that transistor 130 operates in a triode state to provide the characteristics of the preamplifier desired. An advantage of this circuit is that many additional MR channels can be connected to the common cascode line 146. Further, a smaller size may be chosen for transistor 130, minimizing the parasitic capacitance 134 of transistor 130. This small capacitance results in a flat frequency response. However, when the number of MR channels is sufficiently large, a noise problem results, in that the parasitic capacitance 116 of transistor 112 in parallel with the parasitic capacitance 126 of transistor 122 and the parasitic capacitance of the other transistor and algebraically summed as the number of MR channels increase. This resulting summed capacitance presents a noise problem.

FIG. 2 illustrates another design configuration for multiple MR channels. With this design, each MR channel has a individual cascode transistor eliminating the need for the common cascode line 144 of FIG. 1. Without the common cascode line, the effect of parallel capacitance does not occur. The current path of the MR channel 240 includes a transistor 212 controlled by switch 214. Additionally, the MR channel 240 includes a cascode transistor 250 coupled to voltage source 254. The transistor 250 is coupled to the common R-Load 238 through the common load line 260. Since, the capacitance associated with transistor 212 is no longer directly connected to the corresponding transistors in other MR channels, there is no parallel connection, and consequently, no summing of capacitance. However, the cascode transistor 250 has an associated parasitic capacitance 252 connected to the common load line 260. With a number of MR channels connected in parallel to the common load line, these parasitic capacitances associated with each of the cascode transistors for each of the channels are connected in parallel and the effective impedance of these parallel, capacitances is achieved by algebraically summing the capacitance from each of the channels. The frequency response is proportional to 1/RC, where R is the resistive value of resistance 238 and C is the effective impedance. Thus, it can be very clearly seen that as the capacitance increases the frequency response from the preamplifier decreases. For a large number of these channels the high frequency response deteriorates quickly. Thus, both of the prior art circuits do not providing a substantially flat frequency response without a noise problem.

SUMMARY OF THE INVENTION

The present invention is directed to a preamplifier, which is useful to MR heads. The preamplifier provides a substantially flat frequency response without generating or amplifying a large amount of noise. The invention reduces the amount of effective capacitance, resulting from the parasitic capacitances of individual channel cascode transistors. The present invention divides the MR channels into groups and connects each of the groups to a switch, for example, multiplexer with a group load, in order to eliminate the effect of the parasitic capacitance. The MR channels of each groups remain connected in parallel. Each of the MR channels include a current path having a resistance, a control transistor to turn-on and turn-off the current in the current path and a cascode transistor.

The present invention includes a single ended preamplifier, including a first group a first group of channels having at least one transistor having first parasitic capacitance, a second group of channels having at least one transistor having second parasitic capacitance, and a switch to selectively coupled the first group of channels or the second group of channels or the second group of channels and to selectively decouple the second parasitic capacitance or the fist parasitic capacitance, respectively.

A single ended preamplifier further includes a current path and a second switch to control the conductance of current in the current path, and where the first group of channels include at least two channels and the second group of channels include at least two channels.

BRIEF DESCRIPTION OF THE DRAWINGS

The invention and objects and features thereof will be more readily apparent from the following detained description and appended claims when taken with the drawing.

DETAILED DESCRIPTION OF ILLUSTRATIVE EMBODIMENTS

Figure 1:
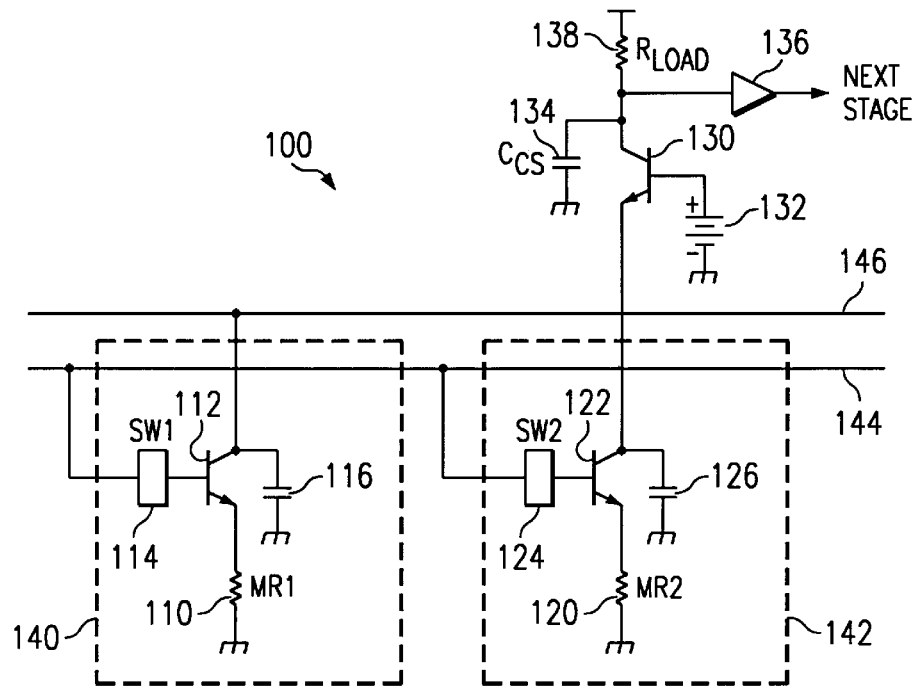
FIG. 1 illustrates a cascoded circuit for a single ended preamp IC.
Figure 2:
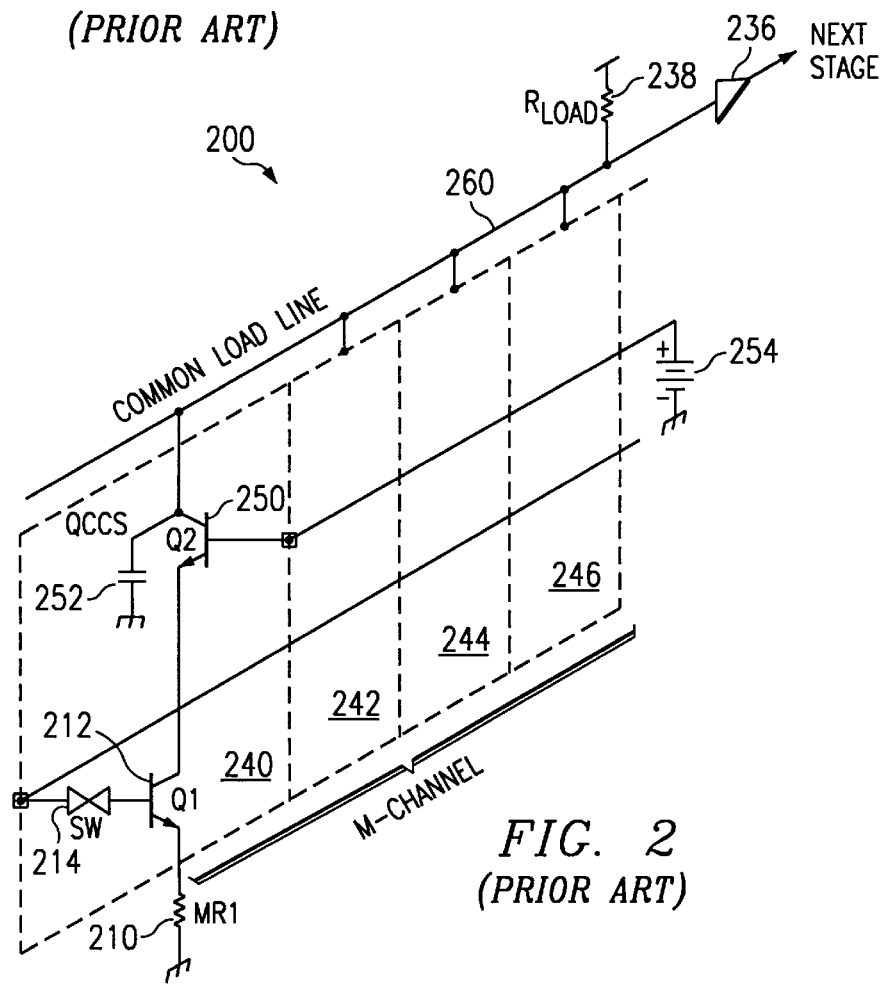
FIG. 2 illustrates a circuit with individual cascoded transistors.
Figure 3:
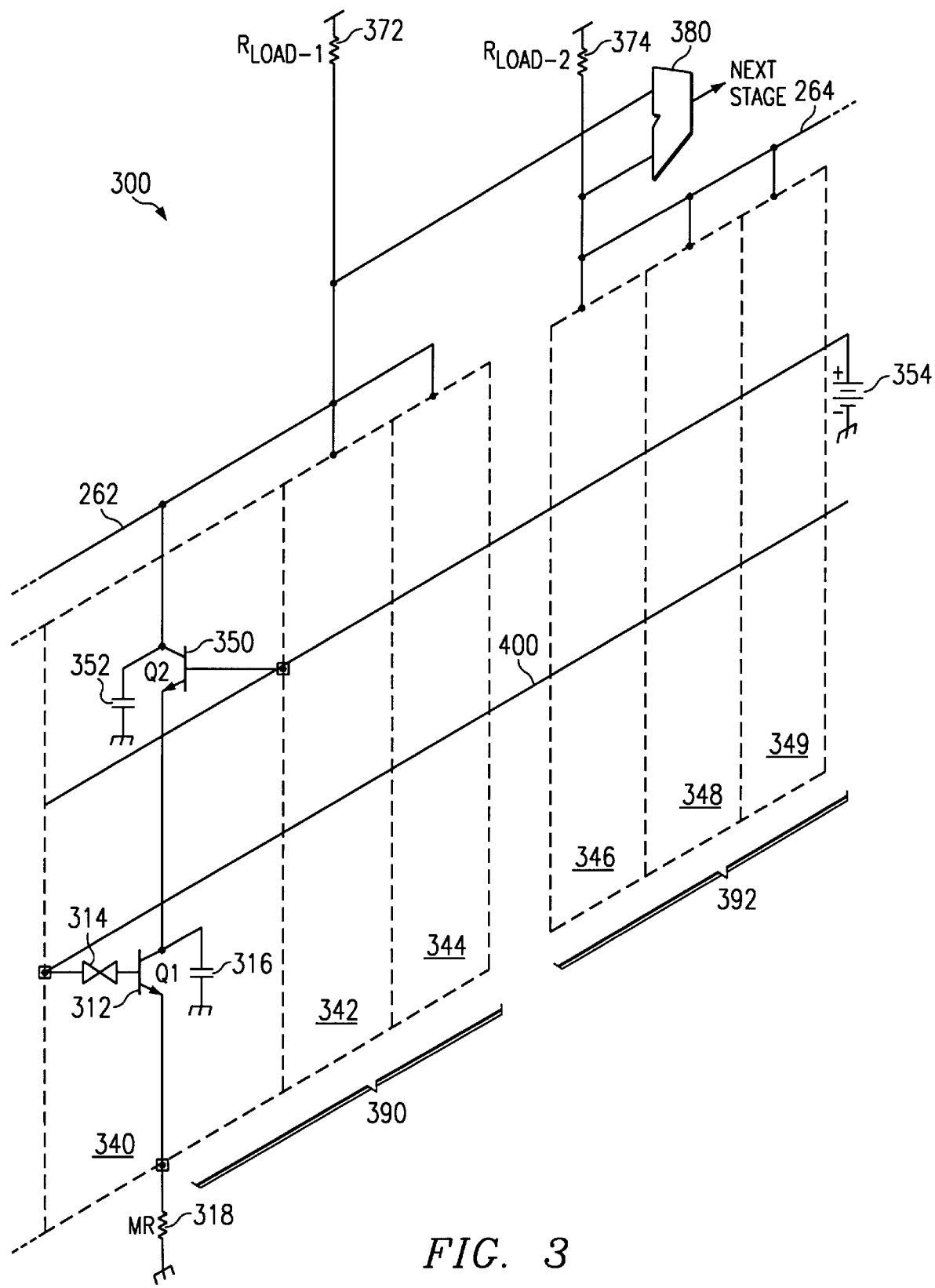
FIG. 3 illustrates a circuit to eliminating noise and providing a flat response.

FIG. 3 illustrates a single ended preamp 300 including a first group 390 of MR channels and a second group 392 of MR channels. Although, the present invention has been described in terms of two groups of MR channels, the present invention could be expanded to include N groups of channels where N is an integer.

Group 390 includes MR channels 340, 342 and 344, while the group 392 includes the MR channels 346, 348 and 349. The present invention describes 3 channels per group. However, the number of channels in a group could be expanded or contracted to be any integer number. Generally, the MR channels are constructed to have a similar circuit. In channel 340, a current path conducts current from the common load line 262 to ground through the MR resistance 318. The control transistor 312 controls the current through the current path. The switch 314 is connected between the base of the transistor 312 and a control line 400. Control signals transmitted through the control line 400 control the switch 314, which in turn controls the control transistor 312 to operate between a conductive state and none conductive state. While transistor 312 is in a conductive state current flows through the current between the emitter and connector of transmitter 312. Associated with transistor 312 is parasitic capacitor 316, this parasitic capacitor is not connected directly to other parasitic capacitors of other transistors in other channels. The current path also includes an individual cascode transistor 350 to perform the amplification. The base of transistor 350 is connected to voltage source 354 to maintain this transistor in a triode state. Associated with transistor 350 is another parasitic capacitor 352. The transistor 350 is connected to the common load line 262. The common load line 262 is connected to the common resistance load 272 and the switch 380 for example, a multiplexer. Each of the MR channels 340, 342 and 344 include an individual cascode transistor with associated parasitic capacitances. However, the limited number of channels in this example 4 in each of the groups prevent the capacitive effect from becoming excessively large and reducing the frequency response.

The group 392 of MR channels is constructed in a similar fashion and is connected to a common load line 264. This common load line 264 is connected to common load resistance 374 and multiplexer 380. Thus, the next stage is connected to the selected group, for example 390 or 392 by the respective common load line.

Since, none of the control transistors of the individual MR channels are directly connected together, a noise problem does not develop. Thus, the present invention does not have a noise problem, and provides flat frequency response.

The group 390 of MR channels is connected to the switch 380, which may be a multiplexer. Additionally, group 392 of MR channels is connected to the switch 380. Since, only one MR channel is generally required to be operative at any given time, the switch 300 is activated to select or couple one group having the MR channel, for example, group 390 to couple MR channel 340. Group 392 would not be coupled and the frequency response would not be limited, due to the parasitic capacitance from the transistor of MR channels 346, 348 and 349.

There has been described an improved low noise preamplifier for a magneto-resistive head. While the invention has been described with reference to one embodiment, the description is illustrative of the invention and is not be construed as limiting the invention. Various modifications and applications may occur to those skilled in the art without departing from the true spirit and scope of the invention as defined by the appended claims.

What is claimed:

1. A single ended preamplifier, comprising:
   a first group of channels having at least one first transistor having first parasitic capacitance and a first MR head connected to said one first transistor;
   a second group of channels having at least one second transistor having second parasitic capacitance and a second MR head connected to said one second transistor; and
   a switch to selectively couple said first group of channels or said second group of channels and to selectively decouple said second parasitic capacitance or said first parasitic capacitance, respectively.

2. A single ended preamplifier as in claim 1, wherein said channels include a current path and a second switch to control the conductance of current in said current path.

3. A single ended preamplifier as in claim 1, wherein said switch is a multiplexer.

4. A single ended preamplifier as in claim 1, wherein said first group of channels include at least two channels and said second group of channels include at least two channels.

* * * * *